United States Patent [19]

Rogers, Jr.

[11] 4,316,108
[45] Feb. 16, 1982

[54] TRACKING FILTER FOR FM THRESHOLD EXTENSION

[76] Inventor: Walter M. Rogers, Jr., 679 Oakridge Dr., Indialantic, Fla. 32903

[21] Appl. No.: 78,906

[22] Filed: Sep. 25, 1979

[51] Int. Cl.$^3$ .............................................. H03L 7/04
[52] U.S. Cl. ..................................... 307/521; 307/512; 307/320; 328/166; 455/339; 455/340
[58] Field of Search ......................... 328/55, 155, 166; 307/320, 262, 233 R, 232; 455/339, 340

[56] References Cited

U.S. PATENT DOCUMENTS

| | | | |
|---|---|---|---|
| 2,915,631 | 12/1959 | Nilssen | 307/320 X |
| 2,976,408 | 3/1961 | Colaguori | 455/205 |
| 3,079,571 | 2/1963 | Elliott et al. | 307/320 X |
| 3,436,647 | 4/1969 | Gobeli et al. | 328/155 X |
| 3,748,499 | 7/1973 | Schaffner | 307/320 X |
| 3,805,173 | 4/1974 | Nakamura et al. | 328/155 |
| 3,821,652 | 6/1974 | Wiebe et al. | 328/155 X |

*Primary Examiner*—John S. Heyman

[57] ABSTRACT

A tracking filter suitable for use in the IF stage of FM receiver circuitry incorporates a bandpass filter the components of which yield a characteristic that permits the filter to provide substantially the entirety of a required 90° phase shift for phase detection control circuitry that rapidly actively tunes capacitive components of the filter without imparting unacceptable group delay behavior to the configuration. The filter is a two-pole pair, single zero at the orgin, bandpass filter inserted in the signal path between a pair of signal power splitters. Part of the input signal is applied from the first splitter to one input of a phase comparator the other input of which is derived from the output signal via the second power splitter. The output of the phase comparator is applied through a broadband control amplifier to actively adjust the center frequency of the bandpass filter. Advantageously, this configuration enables the filter to have its center frequency effectively coincide with the instantaneous frequency of the deviating input signal, whereby an increase in performance over conventional filter approaches is obtained.

16 Claims, 3 Drawing Figures

TRACKING FILTER FOR FM THRESHOLD EXTENSION

FIELD OF THE INVENTION

The present invention relates to a frequency modulation receiver, especially one employing threshold extension techniques, the invention being particularly directed to an improved intermediate frequency tracking filter which can be synchronized in frequency with deviations in the input signal.

BACKGROUND OF THE INVENTION

In communication systems, particularly in receiver equipment wherein information is transmitted using FM signalling techniques, such as found in video transmission systems, various schemes have been developed to improve upon the input signal and carrier to noise ratio at which the equipment can deliver a useful output. These schemes have incorporated frequency modulation feedback and phase-locked loop receivers, and threshold extension applications involving the use of direct tracking filters that are tuned in response to the output of a phase comparator. Examples of demodulator configurations using these approaches are describe in U.S. Pat. Nos. to Wason 3,742,361; Tillotson 3,231,822; Webb 3,517,268; Colaguori 2,976,408 and my own previously developed improvement described in U.S. Pat. No. 4,087,756.

In those arrangements wherein tracking filters are employed, the precision and accuracy with which the tracking filter itself is able to follow the instantaneous frequency of the FM input signal over a relatively wide bandwidth can have a substantial impact on the overall performance of the receiver system.

SUMMARY OF THE INVENTION

With the above background in mind, the present invention focuses upon the tracking filter and the manner in which it operates to provide a performance characteristic superior to heretofore proposed implementations. Briefly, the tracking filter of the present invention incorporates a bandpass filter the components of which yield a characteristic that permits the filter to provide substantially the entirety of a required 90° phase shift for phase detection control circuitry that rapidly actively tunes capacitive components of the filter without imparting unacceptable group delay behavior to the configuration.

For this purpose, a two-pole pair, single zero at the origin, bandpass filter is inserted in the signal path between a pair of signal power splitters. Part of the input signal is applied from the first splitter to one input of a phase comparator the other input of which is derived from the output signal via the second power splitter. The output of the phase comparator is applied through a broadband control amplifier to actively adjust the center frequency of the bandpass filter. Advantageously, this configuration enables the filter to have its center frequency effectively coincide with the instantaneous frequency of the deviating input signal, whereby an increase in performance over conventional filter approaches is obtained.

DETAILED DESCRIPTION

Figure 1:
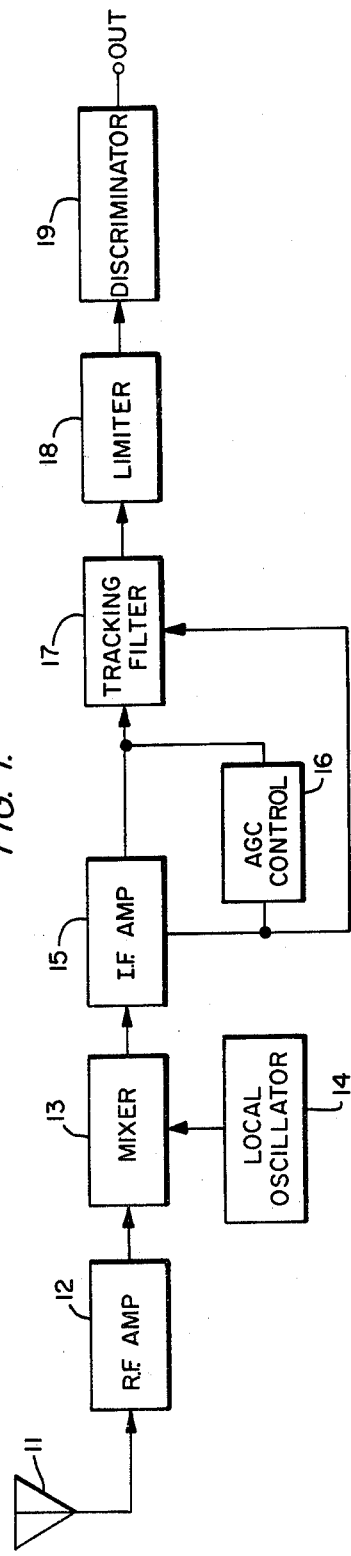
FIG. 1 is a schematic block diagram of a frequency modulation receiver in which the tracking filter of the present invention may be employed.

Referring now to the drawings, wherein like reference characters designate like or corresponding parts, there is shown in FIG. 1 an FM receiver configuration having an antenna 11 for receiving a frequency-modulated signal, such as a radio frequency signal on which a video signal has been frequency modulated. The output of antenna 11 is coupled through an RF amplifier 12 to a first input of a mixer 13. A second input of mixer 13 is derived from a local oscillator 14, with mixer 13 down-converting the RF signal from amplifier 12 to an intermediate frequency signal which is applied to an IF amplifier 15 having an AGC feedback control circuit 16 coupled between the output of amplifier 15 and a control input. As this type of configuration is conventional and well known to those skilled in the art a more detailed description will be omitted. The output of amplifier 15 is coupled to a switchable intermediate frequency tracking filter 17 that is selectively inserted into the signal path output of IF amplifier 15 in accordance with the signal level monitored by AGC control circuit 16. As will be explained below in conjunction with the description of FIG. 2, for large signal-to-noise levels filter 17 may be bypassed in favor of a direct link between the output of IF amplifier 15 and a downstream limiter 18. For practical purposes, in dealing with the adverse signal and carrier to nose ratios involved, necessitating threshold extension, it may be assumed that tracking filter 17 as inserted in the IF signal path. The output of limiter 18 is coupled to a discriminator 19 from which the video signal may be developed.

It should be noted that the FM detection configuration shown in FIG. 1 is not to be considered as limitative of the environment in which the present invention may be employed. Other configurations, such as FMFB implementations for example, may also take advantage of the tracking filter. In modifying the configuration shown in FIG. 1 for FM feedback purposes, the output of discriminator 19 may be coupled through a suitable loop filter to control the output frequency of local oscillator 14, in a conventional manner.

Figure 2:
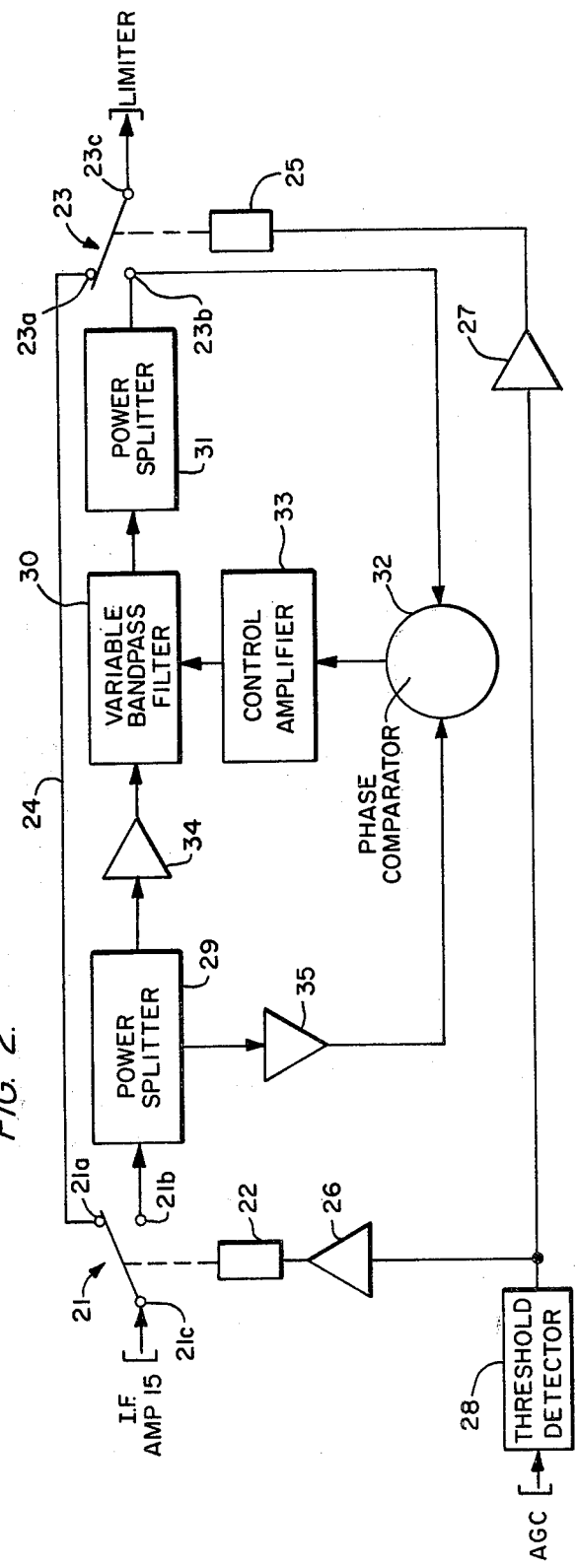
FIG. 2 is a schematic block diagram illustration of the tracking filter shown in FIG. 1.

Referring next to FIG. 2 wherein there is shown a schematic block diagram illustration of the configuration of tracking filter 17, per se, the output of IF amplifier 15 is coupled to the common pole 21c of a first switch, the moveable arm of which is switchable between contacts 21a and 21b in accordance with the output of a relay 22. Relay 22 is controllably energized by the output of AGC control circuit 16 (FIG. 1), via a threshold circuit 28 and driver 26. A second relay 25 is also coupled to the output of threshold circuit 28 through a relay driver 27. Relay 25 is coupled to the moveable arm of switch 23. The common pole 23c of switch 23 is coupled to limiter 18 (FIG. 1), while contact 23a is connected via line 24 to contact 21a of switch 21. Contact 23b is coupled to one output of power splitter 31. Where the FM signal input to the system is strong, so that level gain control action from the output of IF amplifier 15 through AGC control circuit 16 is small, the AGC input to threshold circuit 28 will not produce an output from detector 28 and the components of the tracking filter will be bypassed as the common pole 21c of switch 21 will be coupled through contact 21a, line 24, contact 23a and common pole 23c of switch 23. However, for low signal carrier to noise inputs, the action of the AGC signal will cause the output of IF amplifier 15 to be coupled through switch 21 to the tracking filter proper.

As mentioned briefly above, the tracking filter in accordance with the present invention includes a pair of power dividers 29 and 31 coupled in the IF signal path. The input of power divider 29 is coupled to contact 21b of switch 21 while first and second outputs are coupled to tunable bandpass filter 30 through a first wideband amplifier 34 and one input of a phase comparator 32 through a second wideband amplifier 35. Each of wideband amplifiers 34 and 35 imparts the necessary increase in signal strength for driving respective inputs to tunable bandpass filter 30 and phase comparator 32. Each amplifier should also have good reverse isolation to prevent unwanted signal reflections. The output of bandpass filter 30 is coupled to the input of power divider 31 a first output of which is connected to contact 23b of switch 23, as mentioned previously, and a second output of which is coupled to a second input of phase comparator 32. Phase comparator 32 is conventional in design and produces a voltage which is dependent upon the relative phase between the two input signals applied to it. In operation, phase comparator 32 produces a zero output voltage when the relative phase between its two input signals is 90°. When the phase difference between the outputs of power splitters 29 and 31 departs from 90°, as occurs when the frequency of the input signal departs from the center frequency of bandpass filter 30, a non-zero voltage is produced at the output of phase comparator 32. This voltage is coupled through a broadband amplifier 33 to the control input of bandpass filter 30. As will be explained in detail below in conjunction with the description of FIG. 3, the control input of bandpass filter 30 is coupled to a group of varactor diodes to adjust the center frequency of filter 30 in a direction to bring the phase difference of the two inputs of phase comparator 32 back to 90°, with the end result being that the output of bandpass filter 30, and thereby power divider 31, follows the instantaneous frequency of the IF FM signal.

As was described previously, one of the advantageous characteristics of tunable bandpass filter 30 is the fact that its two pole pairs and a single zero yield nearly a 90° phase shift between its input and output, thereby eliminating the need for a separate component for this purpose alone, such as the 90° phase shift network required in the circuit arrangement described in the above-cited Colaguori patent. In accordance with the tracking filter of the present invention the group delay characteristic around the filter loop is substantially flat over a bandwidth on the order of 8 MHz, so that the adverse influence of separate components, such as the 90° phase shift network of the Colaguori circuit are not encountered. This flat group delay characteristic of the tracking filter of the present invention is particularly significant in a receiver system wherein wideband signals, such as FM video signals, are being tracked. In the Colaguori circuit, referenced above, the 90° phase shift network introduces a non-flat (i.e. hyperbolic) group delay characteristic to the filter which severely limits its application to only relatively narrowband signals.

Figure 3:
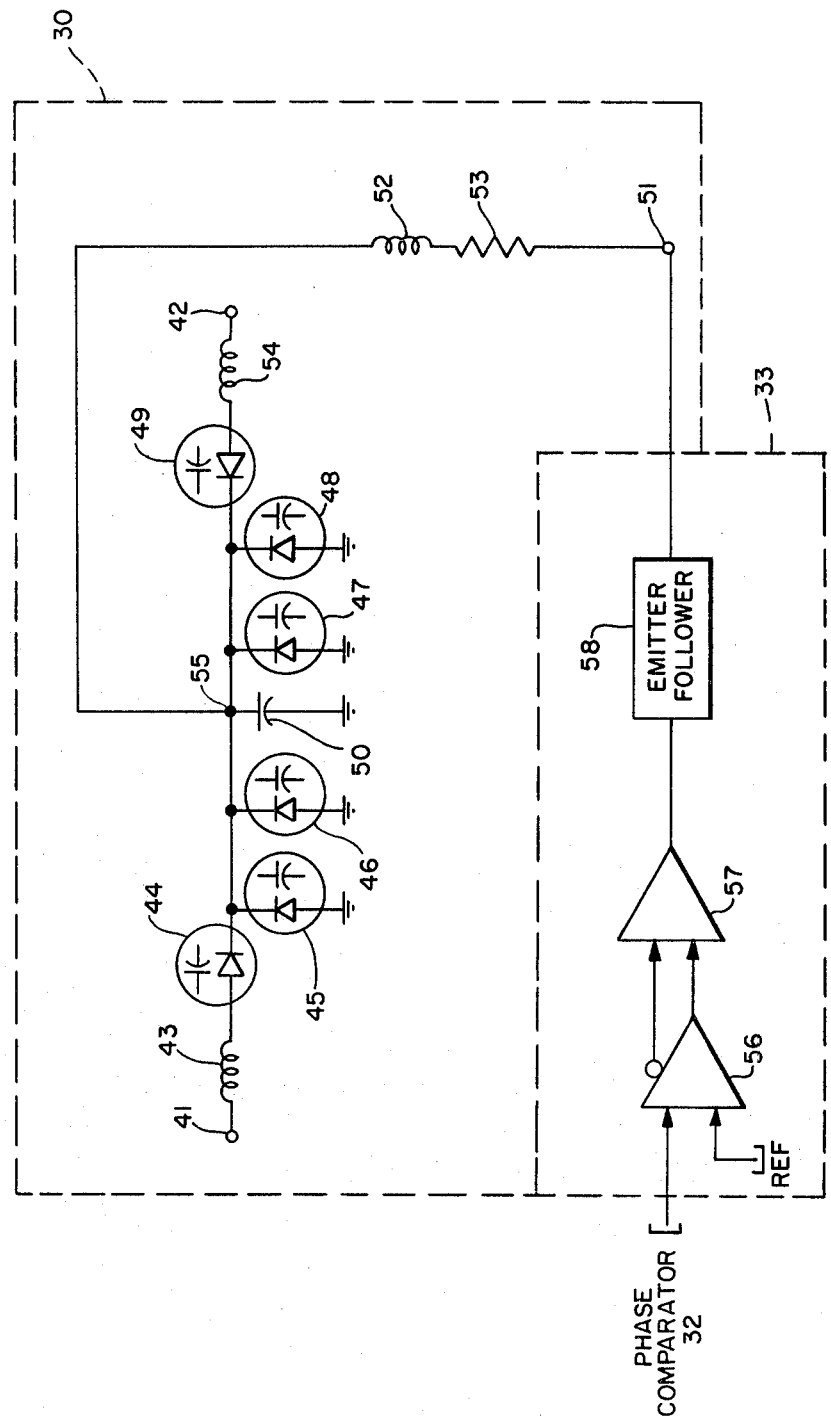
FIG. 3 is a more detailed illustration of the control amplifier and tunable bandpass filter portions of the tracking filter shown in FIG. 2.

Referring to FIG. 3, the circuit configuration of the variable bandpass filter 30 is shown in detail as including an input terminal 41, an output terminal 42, and a control terminal 51, coupled to one output of power splitter 29, the input of power splitter 31 and the output of control amplifier 33, respectively. Coupled between terminals 41 and 42 are a pair of inductors 43 and 54 connected in series with varactor diodes 44 and 49, the cathodes of which are connected in common at node 55. Connected in parallel between node 55 and a source of reference potential (ground) is a capacitor 50 and four varactor diodes 45–47. With these components configured as shown in FIG. 3, the pole-zero plot of the transfer characteristic of the filter yields two pole pairs and only one zero at the origin. Node 55 which constitutes the control node for the varactor diodes of the filter, is connected through a resistor 53 and inductor 52 to control input terminal 51. Filter control input terminal 51 is coupled to the output of control amplifier 33 which couples the output of phase comparator 32 to the tuning node of bandpass filter 30. For this purpose, control amplifier 33 may comprise an operational amplifier. Unfortunately, commercially available operational amplifiers tend to be implemented for multi-purpose applications and suffer a typical thruput delay of five to ten nanoseconds which is unacceptable for the purposes of the present invention. Accordingly, operational amplifier 33 is comprised of reduced complexity components, specifically a pair of cascaded differential amplifiers 56 and 57 driving an emitter follower 58 as shown. The output of phase comparator 32 is coupled to the non-reference input of differential amplifier 56 while the output of emitter follower 58 is coupled to control input 51 of filter 30. Advantageously, because of its reduced complexity and lack of conventional feedback circuitry, control amplifier 33 suffers only a very slight thruput delay on the order of one to two nanoseconds.

As was pointed out above, with the tracking filter configuration shown in FIG. 3, a phase shift of approximately 90° at the center frequency of the IF passband of interest is attainable. For the example referenced previously, it turns out that the phase shift through filter 30 is slightly less but not quite equal to this 90° figure. The few degrees difference is made up by providing a very small path length imbalance in the two input lines to phase detector 32 to achieve the needed 90°. For this purpose, on the printed circuit board on which the filter components are mounted, a small length of conductor cable (on the order of a few inches) may be inserted between the output of power splitter 29 and input of amplifier 34, thereby increasing the total phase lag from the output of power splitter 29 to the output of bandpass filter 30 to the 90° value.

Now considering the operation of the tracking filter in an FM receiver, such as shown in FIG. 1, when an FM signal is received at antenna 11, the IF signal applied to tracking filter 17 deviates about its center frequency. This deviation causes phase comparator 32 to produce a control voltage that is coupled through amplifier 33 to the control terminal 51 of bandpass filter 30. This control voltage at terminal 51, corresponding to the instantaneous frequency deviation, is coupled through resistor 53 and inductor 52 to node 55, thereby adjusting the capacitance of the varactor diodes 44–49 and causing the center frequency of the filter to coincide with that of the instantaneous IF frequency, whereby the filter tracks the incoming FM signal.

As will be appreciated from the foregoing description of the present invention, the two pole pairs and single zero at the origin characteristic of the bandpass filter employed as the tracking filter enables the phase deviation responsive tuning of the filter to be accomplished without need for additional components that adversely affect performance of the receiver in which the filter is employed. The voltage tuned bandpass filter of the present invention inherently produces a substantially 90° phase shift through it to provide the phase comparator with quadrature input signals, and contributes to a substantially flat group delay characteristic around the filter loop. This flat group delay characteristic is especially advantageous over conventional schemes, since it enables the tracking filter of the present invention to accurately track wideband FM video signals for which the narrowband filtering approaches of the prior art are inferior. As was mentioned previously, in tracking filters of the prior art, such as that described in the above referenced Colaguori patent, the use of a discrete 90° phase shifter introduces a non-linear (i.e. hyperbolid) group delay characteristic which, while tolerable for the narrowband use intended in the patent, introduces significant distortion in wideband applications (such as FM video signals) that can be tracked by the filter of the present invention without such distortion. Performance of the inventive configuration has shown a one to two dB improvement in the SNR/CNR characteristic compared to conventional schemes. This degree of improvement is particularly significant in video transmission systems, such as those using satellite data links, where threshold extension techniques are commonly used.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A tracking filter circuit comprising:
    a bandpass filter the center frequency of which is adjustable to follow the frequency of an input signal applied thereto and including means for providing a prescribed phase shift to an input signal applied thereto;
    a phase comparator, coupled to the input and output of said bandpass filter, for comparing the phase between said input signal and the output of said bandpass filter and for producing a control signal representative of the phase difference between said input signal and the output of said bandpass filter; and
    means, coupled between said phase comparator and said bandpass filter, for applying said control signal to said filter to adjust the center frequency of said bandpass filter to follow the frequency of said input signal; and wherein
    said phase shift providing means operates such that, in response to a change in the frequency of said input signal, said phase comparator produces a control signal for changing the center frequency of said bandpass filter, and said prescribed phase shift provided by said bandpass filter at the center frequency to which said bandpass filter was previously tuned is the same as that at the changed center frequency to which said bandpass filter is newly tuned.

2. A tracking filter according to claim 1, wherein the transfer characteristic of said bandpass filter is such that it has two pole pairs and a single zero at the origin.

3. A tracking filter circuit according to claim 1, wherein said bandpass filter comprises first and second inductors and first and second variable capacitance diodes formed in a series connection between the input and output of said filter, and at least one variable capacitance diode connected between said series connection and a reference potential terminal and a control input connected between the output of said control signal applying means and said variable capacitance diodes.

4. A tracking filer according to one of claims 1, 2 or 3, wherein said control signal applying means comprises an operational amplifier coupled between the output of said phase comparator and the control input of said bandpass filter.

5. A tracking filter according to claim 4, wherein said operational amplifier is comprised of first and second differential amplifiers connected in cascade and an emitter follower circuit coupled to the output of said second differential amplifier.

6. A tracking filter according to claim 1, wherein said prescribed phase shift through said bandpass filter is approximately equal to ninety degrees.

7. A tracking filter according to one of claims 1 or 2, wherein the group delay characteristic from the output of said bandpass filter to the output of said control signal applying means is substantially flat.

8. A tracking filter according to one of claims 1, 2, or 6 wherein said phase comparator is a phase comparator the output of which is zero in response to the phase difference between a pair of signals applied to its inputs being ninety degrees.

9. A tracking filter comprising:
    an input;
    an output;
    a bandpass filter the center frequency of which is adjustable to follow the frequency of an input signal applied thereto, said bandpass filter being coupled between said input and said output and including means for providing a prescribed phase shift from said input through said bandpass filter to said output of effectively ninety degrees;
    first means, coupled to said input and said output, for comparing the phase between signals appearing at said input and output and producing a control signal representative of the phase difference between said signals; and
    second means, coupled between said first means and said bandpass filter, for applying said control signal to said bandpass filter to adjust the center frequency of said bandpass filter to follow the frequency of an input signal applied to said input, whereby
    said phase shift providing means operates such that in response to a change in the frequency of said input signal, said first means produces a control signal for changing the center frequency of said bandpass filter, and said ninety degrees phase shift provided by said bandpass filter at the center frequency to which said bandpass filter was previously tuned remains unchanged at the changed center frequency to which said bandpass filter is newly tuned.

10. A tracking filter according to claim 9, wherein the transfer characteristic of said bandpass filter is such that it has two pole pairs and a single zero at the origin.

11. A tracking filter according to claim 10, wherein the group delay characteristic from the output of said bandpass filter to the output of said second means is substantially flat.

12. A tracking filter according to claim 9, wherein said first means comprises a phase comparator the output of which is zero in response to the phase difference between a pair of signals applied to its inputs being ninety degrees.

13. A tracking filter comprising:
an input;
an output;
a bandpass filter the center frequency of which is adjustable to follow the frequency of an input signal applied thereto, said bandpass filter being coupled between said input and said output and including means for providing a phase shift from said input through said bandpass filter to said output of effectively ninety degrees;
first means having first and second input terminals for comparing the phase between signals applied to said first and second input terminals and producing a control signal representative of the phase difference between said signals;
second means, coupled between said first means and said bandpass filter, for applying a control signal from said first means to said bandpass filter so as to cause the center frequency of said bandpass filter to follow the frequency of an input signal applied thereto; and wherein
said input is coupled to the first input terminal of said first means and said output is coupled to the second input terminal of said first means and the effective phase shift from said input through said bandpass filter to the second input of said first means is ninety degrees, and
said phase shift providing means operates such that in response to a change in the frequency of said input signal, said first means produces a control signal for changing the center frequency of said bandpass filter, and said ninety degrees phase shift provided by said bandpass filter at the center frequency to which said bandpass filter was previously tuned remains unchanged at the changed center frequency to which said bandpass filter is newly tuned.

14. A tracking filter according to claim 13, wherein the transfer characteristic of said bandpass filter is such that it has two pole pairs and a single zero at the origin.

15. A tracking filter according to claim 14, wherein the group delay characteristic from the output of said bandpass filter to the output of said second means is substantially flat.

16. A tracking filter according to claim 13, wherein said first means is a phase comparator the output of which is zero in response to the phase difference between a pair of input signals applied to said first and second input terminals being ninety degrees.

* * * * *